United States Patent
Chong et al.

(10) Patent No.: US 10,325,893 B2
(45) Date of Patent: Jun. 18, 2019

(54) MASS TRANSFER OF MICRO STRUCTURES USING ADHESIVES

(71) Applicant: Hong Kong Beida Jade Bird Display Limited, Hong Kong (HK)

(72) Inventors: Wing Cheung Chong, Tseung Kwan O (HK); Lei Zhang, Albuquerque, NM (US); Fang Ou, Monterey Park, CA (US); Qiming Li, Albuquerque, NM (US)

(73) Assignee: HONG KONG BEIDA JADE BIRD DISPLAY LIMITED, Hong Kong (HK)

( * ) Notice: Subject to any disclaimer, the term of this patent is extended or adjusted under 35 U.S.C. 154(b) by 0 days.

(21) Appl. No.: 15/836,703

(22) Filed: Dec. 8, 2017

(65) Prior Publication Data

US 2018/0166429 A1    Jun. 14, 2018

Related U.S. Application Data

(60) Provisional application No. 62/433,741, filed on Dec. 13, 2016.

(51) Int. Cl.
*H01L 21/00* (2006.01)
*H01L 25/16* (2006.01)
(Continued)

(52) U.S. Cl.
CPC ............ *H01L 25/167* (2013.01); *H01L 27/15* (2013.01); *H01L 33/00* (2013.01);
(Continued)

(58) Field of Classification Search
CPC ..... H01L 25/50; H01L 27/156; H01L 25/167; H01L 27/1262; H01L 27/124; H01L 25/00; H01L 25/16; H01L 27/12; H01L 27/15
See application file for complete search history.

(56) References Cited

U.S. PATENT DOCUMENTS

2011/0299044 A1*  12/2011  Yeh ................. H04N 9/315
                                              353/52
2013/0026511 A1   1/2013  Yeh et al.
(Continued)

FOREIGN PATENT DOCUMENTS

WO   WO 2017/112675 A1   6/2017

OTHER PUBLICATIONS

PCT International Search Report and Written Opinion, PCT Application No. PCT/US17/65553, dated Feb. 22, 2018, 18 pages.
(Continued)

*Primary Examiner* — Charles D Garber
*Assistant Examiner* — Abdulfattah B Mustapha
(74) *Attorney, Agent, or Firm* — Fenwick & West LLP

(57) ABSTRACT

Mass transfer of micro structures are effected from one substrate to another using adhesives. In the context of an integrated micro LED display, a micro LED array is fabricated on a native substrate and corresponding CMOS pixel drivers are fabricated on a separate substrate. The micro LED substrate (e.g., sapphire) and the CMOS substrate (e.g., silicon) may be incompatible. For example, they may have different thermal coefficients of expansion which make it difficult to bond the micro LEDs to the pixel driver circuitry. The micro LED array is transferred to an intermediate substrate (e.g., silicon) by use of an adhesive. This intermediate substrate may be used in a process of bonding the micro LED array to the array of pixel drivers. The intermediate substrate is separated from the micro LED array by releasing the adhesive.

18 Claims, 25 Drawing Sheets

(51) Int. Cl.
- *H01L 33/62* (2010.01)
- *H01L 33/00* (2010.01)
- *H01L 27/15* (2006.01)
- *H01L 33/08* (2010.01)
- H01L 25/075 (2006.01)
- H01L 27/12 (2006.01)
- H01L 33/32 (2010.01)

(52) U.S. Cl.
CPC .......... *H01L 33/0079* (2013.01); *H01L 33/08* (2013.01); *H01L 33/62* (2013.01); *H01L 25/0753* (2013.01); *H01L 27/124* (2013.01); *H01L 27/1255* (2013.01); *H01L 33/32* (2013.01); *H01L 2933/0066* (2013.01)

(56) References Cited

U.S. PATENT DOCUMENTS

| | | | |
|---|---|---|---|
| 2014/0091993 A1 | 4/2014 | Lau et al. | |
| 2015/0371585 A1* | 12/2015 | Bower | G09G 3/32 345/1.1 |
| 2015/0371974 A1 | 12/2015 | Bower et al. | |
| 2016/0155892 A1* | 6/2016 | Li | H01L 24/00 257/89 |
| 2017/0263593 A1* | 9/2017 | Zou | H01L 33/0079 |

OTHER PUBLICATIONS

U.S. Appl. No. 15/135,217, filed Apr. 21, 2016, Inventors: Lei Zhang et al.
U.S. Appl. No. 15/269,954, filed Sep. 19, 2016, Inventors: Lei Zhang et al.
U.S. Appl. No. 15/269,956, filed Sep. 19, 2016, Inventors: Lei Zhang et al.
U.S. Appl. No. 15/272,410, filed Sep. 21, 2016, Inventors: Lei Zhang et al.
U.S. Appl. No. 62/420,260, filed Nov. 10, 2016, Inventors Wing Cheung Chong et al.
U.S. Appl. No. 15/701,450, filed Sep. 12, 2017, Inventors: Wing Cheung Chong et al.

* cited by examiner

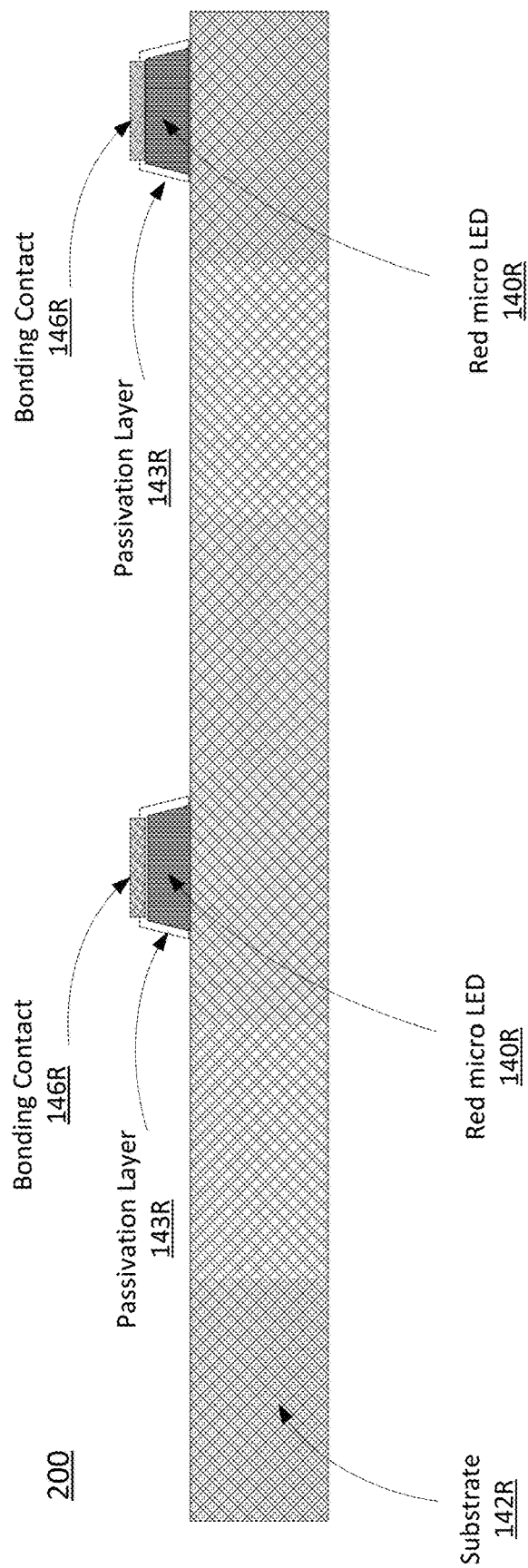

MASS TRANSFER OF MICRO STRUCTURES USING ADHESIVES

CROSS-REFERENCE TO RELATED APPLICATION(S)

This application claims priority under 35 U.S.C. § 119(e) to U.S. Provisional Patent Application Ser. No. 62/433,741, "Mass Transfer of Micro Structures using Adhesives," filed Dec. 13, 2016. The subject matter of all of the foregoing is incorporated herein by reference in their entirety.

BACKGROUND

1. Technical Field

This disclosure relates generally to methods for fabricating semiconductor devices, including integrated multi-color micro LED display panels.

2. Description of Related Art

Active matrix liquid-crystal displays (LCD) and organic light emitting diode (OLED) displays combined with thin-film transistor (TFT) technology are becoming increasingly popular in today's commercial electronic devices. These displays are widely used in laptop personal computers, smartphones and personal digital assistants. Millions of pixels together create an image on a display. The TFTs act as switches to individually turn each pixel on and off, rendering the pixel light or dark, which allows for convenient and efficient control of each pixel and of the entire display.

However, conventional LCD displays suffer from low light efficiency, causing high power consumption and limited battery operation time. While active-matrix organic light-emitting diode (AMOLED) display panels generally consume less power than LCD panels, an AMOLED display panel can still be the dominant power consumer in battery-operated devices. To extend battery life, it is desirable to reduce the power consumption of the display panel.

Conventional inorganic semiconductor light emitting diodes (LEDs) have demonstrated superior light efficiency, which makes active matrix LED displays more desirable for battery operated electronics. Arrays of driver circuitry and lighting-emitting diodes (LEDs) are used to control millions of pixels, rendering images on the display. Both single-color display panels and full-color display panels can be manufactured according to a variety of fabrication methods.

However, the integration of thousands or even millions of micro LEDs with a pixel driver circuit array is quite challenging. Various fabrication methods have been proposed. In one approach, control circuitry is fabricated on one substrate and micro LEDs are fabricated on a separate substrate. The micro LEDs are picked and placed one or a few at a time onto the substrate with the control circuitry. However, this fabrication process is inefficient and costly.

In another approach, the entire micro LED array with its original substrate is aligned and bonded to the control circuitry using metal bonding. The substrate on which the micro LEDs is fabricated remains in the final product, which may cause light cross-talk. Additionally, the thermal mismatch between the two different substrates generates stress at the bonding interface, which can cause reliability issues. Furthermore, multi-color display panels typically require more micro LEDs and different color micro LEDs grown on different substrate materials, compared with single-color display panels, thus making the traditional manufacturing process even more complicated and inefficient.

As a result, there is a need for better manufacturing methods, both for micro LED displays as well as other types of semiconductor devices with micro structures.

SUMMARY

The present disclosure overcomes the limitations of the prior art by providing mass transfer of micro structures from one substrate to another using adhesives. In the context of an integrated micro LED display, a micro LED array is fabricated on a native substrate and corresponding CMOS pixel drivers are fabricated on a separate substrate. The micro LED substrate (e.g., sapphire) and the CMOS substrate (e.g., silicon) may be incompatible. For example, they may have different thermal coefficients of expansion which make it difficult to bond the micro LEDs to the pixel driver circuitry while both are still on their original substrates. Accordingly, the micro LED array is transferred to an intermediate substrate (e.g., silicon) by use of an adhesive. This intermediate substrate may be used in a process of bonding the micro LED array to the array of pixel drivers. The intermediate substrate is then separated from the micro LED array by releasing the adhesive.

Other aspects include components, devices, systems, improvements, methods, processes, applications, computer readable mediums, and other technologies related to any of the above.

BRIEF DESCRIPTION OF THE DRAWINGS

Embodiments of the disclosure have other advantages and features which will be more readily apparent from the following detailed description and the appended claims, when taken in conjunction with the examples in the accompanying drawings, in which:

FIG. 1C is a cross-sectional view of a micro LED die with an array of micro LEDs fabricated on a sapphire substrate, according to one embodiment.

DETAILED DESCRIPTION OF THE PREFERRED EMBODIMENTS

The figures and the following description relate to preferred embodiments by way of illustration only. It should be noted that from the following discussion, alternative embodiments of the structures and methods disclosed herein will be readily recognized as viable alternatives that may be employed without departing from the principles of what is claimed.

The following examples primarily use an integrated micro LED display in which array(s) of GaN micro LEDs are attached to CMOS pixel drivers by eutectic bonding, but these are just examples and the techniques described are not limited to this particular application. Examples of micro LEDs include GaN based UV/blue/green micro LEDs, AlInGaP based red/orange micro LEDs, and GaAs or InP based infrared (IR) micro LEDs. Additional examples of micro LEDs and other micro structures are described in U.S. patent application Ser. No. 15/135,217 "Semiconductor Devices with Integrated Thin-Film Transistor Circuitry", Ser. No. 15/269,954 "Making Semiconductor Devices with Alignment Bonding and Substrate Removal", Ser. No. 15/269,956 "Display Panels with Integrated Micro Lens Array", Ser. No. 15/272,410 "Manufacturing Display Panels with Integrated Micro Lens Array", and Ser. No. 15/701,450 "Multi-Color Micro-LED Array Light Source". All of the foregoing are incorporated by reference in their entirety. The concepts described herein can also be used to mass transfer other micro structures and devices, such as VCSELs (vertical cavity surface-emitting lasers), laser diodes, photodetectors, MEMS and power devices. Besides eutectic bonding, electrically conductive bonding of micro LEDs to the driver circuitry can also be achieved using adhesives with electrically conductive particles immersed in the adhesive.

Figure 1A:
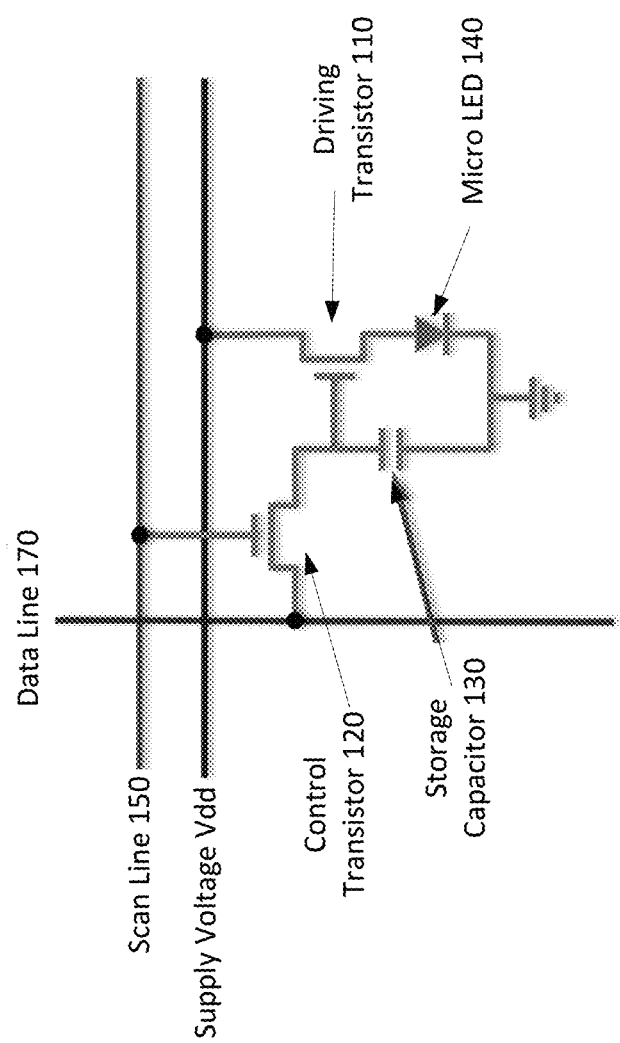
FIG. 1A is a circuit diagram of a pixel for an integrated micro LED display, according to one embodiment.

FIG. 1A is a circuit diagram of a pixel for an integrated micro LED display, according to one embodiment. The pixel includes a pixel driver and micro LED 140. In this example, the pixel driver includes two transistors and one capacitor 130, with one transistor being a control transistor 120 and the other being a driving transistor 110. The control transistor 120 is configured with its gate connected to a scan signal bus line 150, its one source/drain connected to a data signal bus line 170, and the other drain/source connected to the storage capacitor 130 and to the gate of the driving transistor 110. One source/drain of the driving transistor 110 is connected to a voltage supply Vdd, and the other drain/source is connected to the p-electrode of the micro LED 140. The n-electrode of the micro LED 140 is connected to the capacitor 130 and to ground. In this example, when the scan signal 150 opens the gate of the control transistor 120, the data signal 170 charges the storage capacitor 130 and sets the driving transistor 110's gate voltage, which controls the current flow through the micro LED 140. The storage capacitor 130 here is used to maintain the gate voltage of the driving transistor 110, thus maintaining the current flowing through the micro LED 140 during the time that the scan signal 150 is setting other pixels.

Figure 1B:
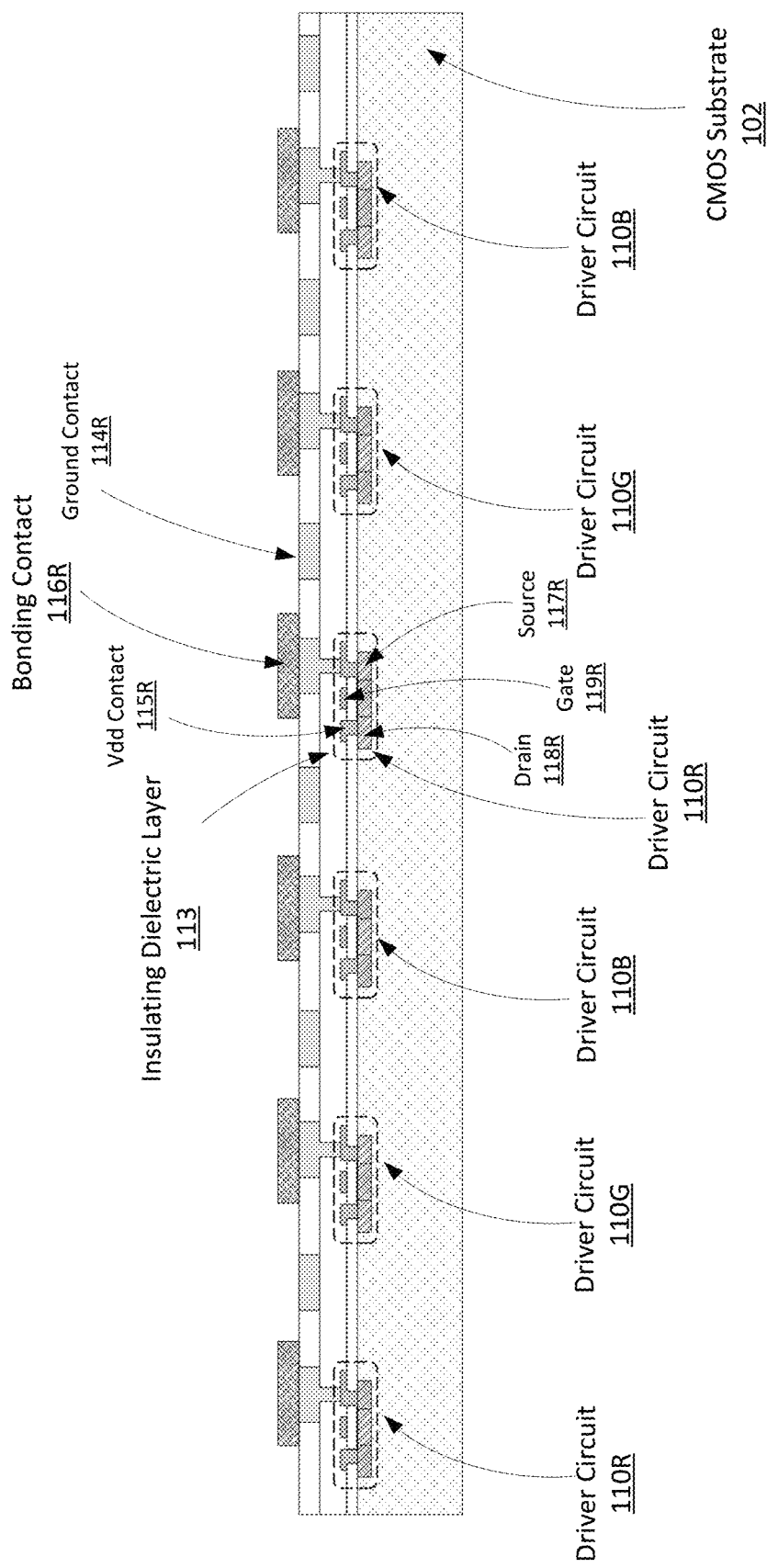
FIG. 1B is a cross-sectional view of a CMOS die with an array of pixel drivers fabricated on a silicon substrate, according to one embodiment.

The pixel drivers for the integrated micro LED display typically are fabricated on one substrate, as shown in FIG. 1B. The micro LEDs are fabricated on a different substrate, as shown in FIG. 1C. The integrated micro LED display is created by integrating the micro LEDs with their corresponding pixel drivers, which as described below is achieved using a mass transfer process using adhesives and intermediate substrates.

FIG. 1B is a cross-sectional view of a CMOS die with an array of pixel drivers fabricated on a silicon substrate, according to one embodiment. In FIG. 1B, an array of individual driver circuits 110 are fabricated on the CMOS substrate 102. The driver circuits 110 are labeled with suffixes R,G,B, because they correspond to red, green and blue pixels. In this example, comparing to FIG. 1A, only the driving transistor 110 of each pixel driver circuit is shown in FIG. 1B for clarity. The driving transistor 110 is a CMOS driver circuit with its source 117 connected to a contact 116 that will be bonded to the corresponding micro LED. In alternative embodiments not shown, the driver circuitry can also be TFT circuitry on glass or flexible substrate.

For clarity, FIG. 1B shows only six driver circuits 110 labeled with 110R, 110G and 110B, which corresponds to red micro LEDs, green micro LEDs and blue micro LEDs, as described below. It should be understood that the driver circuitry can include a different number of driver circuits. In a fully programmable display panel, the micro LEDs and driver circuits are arranged in arrays to form an array of individually addressable pixels, preferably color pixels. In alternate embodiments, the display panel may have a more limited programmability and the pixels may be arranged in different geometries. In addition, there does not have to be a one to one correspondence between driver circuits and micro LEDs. For example, there could be two or more micro LEDs connected to the same pixel driver output to create redundancy, so that if one of the micro LEDs fails, the remaining micro LEDs could still light the pixel.

Returning to FIG. 1B, the driver circuitry 100 is fabricated as follows. The CMOS substrate 102 is the substrate on which the array of individual driver circuits 110 is fabricated. In one embodiment, the substrate 102 is a Si substrate. In another embodiment, the supporting substrate 102 is a transparent substrate, for example, a glass substrate. Other example substrates include GaAs, GaP, InP, SiC, ZnO, sapphire or flexible substrates.

The driver circuits 110 form individual pixel drivers to drive micro LEDs that will be bonded to the driver circuits, as described below. In the example shown in FIG. 1B, a driver circuit 110 is a CMOS driver circuit that includes a source 117, a drain 118 and a gate 119. The source 117 is further connected to an electrode that contacts the bonding contact 116. The drain 118 is connected to an external voltage supply via a Vdd contact 115. In alternate embodiments, the position of the drain 118R and the source 117R can be switched depending on the channel type of the driver circuit 110R (e.g., n-channel or p-channel FET).

An insulating dielectric layer 113 is formed to electrically separate the Vdd contact 115, the gate 119 and the electrode from the source 117. A ground contact 114 is also formed within each pixel driver, to which the corresponding micro LED will be connected. The micro LED will contact the bonding contact 116 on one side and the ground contact 114 on the other side. In alternative embodiments not shown, the driver circuitry can include driver circuits other than CMOS driver circuits. As one example, the driver circuitry may include thin-film transistor (TFT) driver circuits. As another example, the driver circuitry can use III-V compound semiconductors.

As more fully described below, a bonding contact 116 is formed for each driver circuit 110 on top of the insulating dielectric layer 113 to make contact with a bonding contact of a corresponding micro LED, enabling the driver circuit 110 to be electrically coupled to the micro LED. The bonding contact 116 is an ohmic contact, for example a metal contact.

FIG. 1C is a cross-sectional view of a micro LED die with an array of red micro LEDs 140R fabricated on a GaAs substrate 142R. In other embodiments, the micro LEDs can be blue or green micro LEDs and the substrate can be a sapphire, SiC or Si substrate. The micro LEDs 140 preferably are 20 microns or smaller in size. In one embodiment, the micro LEDs 140R are arranged in an array on the substrate 142R to form a fully programmable display panel with individually addressable pixels after the micro LEDs are integrated onto the CMOS die shown in FIG. 1B. For clarity, FIG. 1C shows only two micro LEDs 140R fabricated on the substrate 142R. It should be understood that the micro LED die can include a different number of micro LEDs, and that multiple die can be used, for example different die for red, green and blue micro LEDs.

The micro LEDs 140R are epitaxially grown on the substrate 142R. A passivation layer 143R is formed to electrically isolate individual micro LEDs 140R on the micro LED die, and a bonding layer is formed on top of the micro LEDs, in which case for each of the micro LEDs, a bonding contact 146R is formed to electrically coupled to a corresponding driver circuit 110R as described above in FIG. 1B.

In FIG. 1C, the micro LEDs 140R are red micro LEDs. In alternative embodiments not shown, a micro LED die including ultraviolet (UV) micro LEDs covered with phosphor layers or nano-particles can also be used to form a full-color micro LED display. Single-color micro LED display panels can also be fabricated. Alternately, same color micro LEDs with different color phosphors or nano-particles may be used to fabricate a multi-color display.

Micro LEDs typically have a pair of contacts, one to the p-layer and one to the p-layer of the micro LED. In the embodiment of FIG. 1C, only one contact of the pair is connected via the bonding process. In this example, the bonding contact 146 is connected to the p-layer of the micro LED.

FIGS. 2-9 illustrate various examples for bonding the micro LED arrays with the pixel driver arrays. These are based on mass transfer of the micro LED arrays to intermediate substrates using adhesives. For example, the micro LED arrays may be transferred to a carrier substrate that is more thermally compatible with the CMOS substrate. If the bonding process occurs at an elevated temperature, different thermal coefficients of expansion may prevent bonding of the arrays of micro LEDs and pixel drivers while they are still on their native substrates due to misalignment or internal stresses caused by the different rates of thermal expansion. However, these problems can be overcome by first transferring the micro LED array to an intermediate substrate that has a more compatible thermal coefficient of expansion.

For example, the CMOS pixel drivers typically are fabricated on a silicon substrate, but GaN-based micro LEDs may be grown on a sapphire substrate. Thermal mismatch between silicon and sapphire makes it difficult to bond an array of micro LEDs to an array of pixel drivers with an acceptable transfer yield. Instead, the Ga-based micro LEDs may first be mass transferred to an intermediate silicon substrate and then bonded to the array of pixel drivers.

Figure 2A:
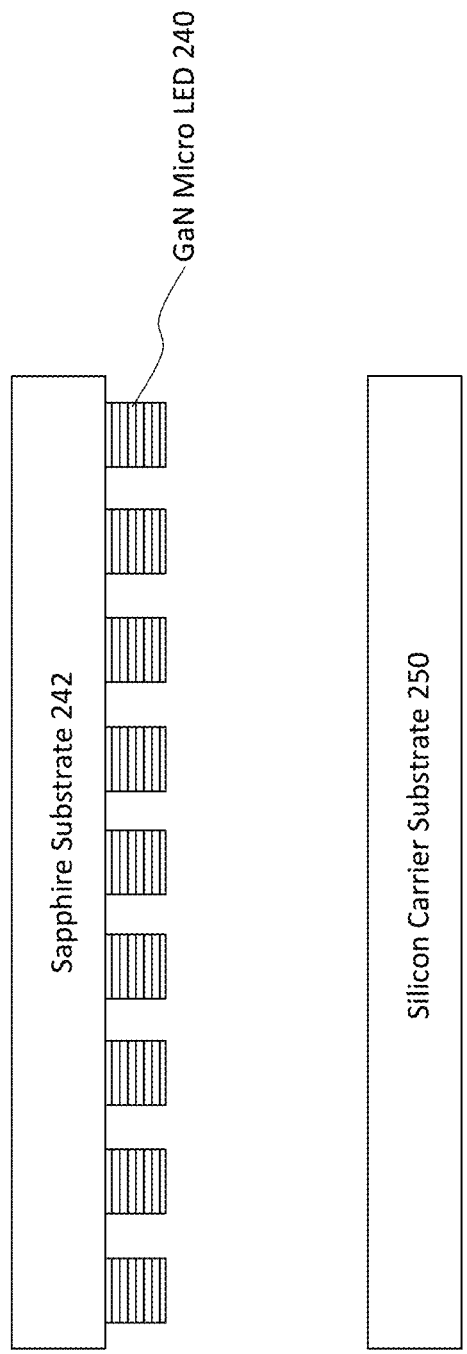
FIGS. 2A-2F are cross-sectional views illustrating fabrication of an integrated micro LED display panel by a single flip mass transfer adhesive process, according to one embodiment.

FIGS. 2A-2F are cross-sectional views illustrating fabrication of an integrated micro LED display panel by a single flip mass transfer adhesive process, according to one embodiment. FIG. 2A shows an array of GaN micro LEDs 240 fabricated on a native sapphire substrate 242. The micro LED array 240 is to be attached to a corresponding array of pixel drivers on a CMOS substrate (see FIG. 2E). The transfer is effected by mass transfer of the micro LED array 240 to an intermediate substrate 250 using an adhesive. In this example, the intermediate substrate 250 is silicon, to match the thermal expansion of the substrate with the CMOS circuitry.

Figure 2B:
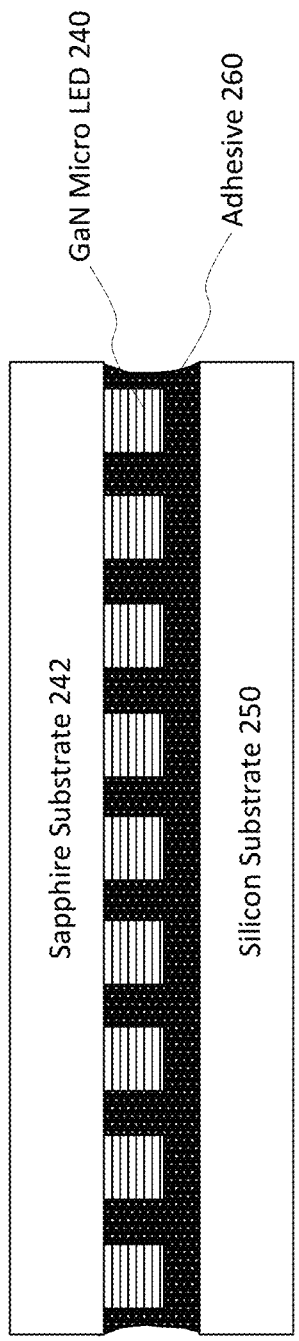
Figure 2C:
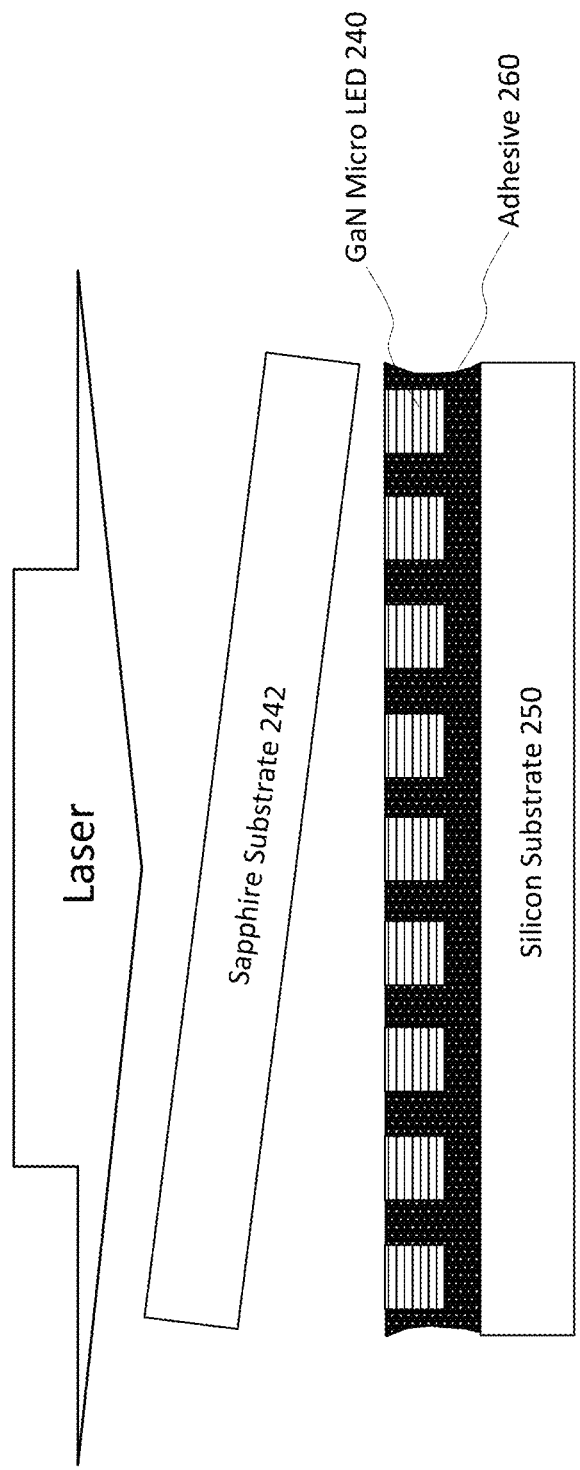

FIGS. 2B-2C illustrate transfer of the micro LED array from the original sapphire substrate 242 to the silicon carrier substrate 250. In FIG. 2B, the micro LED array 240 and native substrate 242 are attached to the silicon substrate 250 by an adhesive 260. Examples of adhesives include epoxy-based polymers such as SU-8, benzocyclobutene (BCB), polyimide, polybenzoxazole (PBO), silicone or thermal release coating. The adhesive could be photosensitive, in which case UV or other irradiation is used to cure the adhesive. Alternatively, thermal treatment may be used to cure the adhesive. Here, the carrier substrate 250 is silicon, but sapphire, glass, ceramic and polymer substrates are other example materials that can be used for carrier substrates.

In FIG. 2C, the native sapphire substrate 242 is removed from the micro LED array 240. In this example, the substrate removal is achieved by laser irradiation. Other techniques such as wet chemical etching, dry etching or chemical mechanical polishing (CMP) could be used for substrate removal processes. For GaN micro LEDs on a transparent substrate such as sapphire, substrate removal may be done by laser irradiation. For GaN micro LEDs on a silicon substrate, substrate removal may be done by CMP followed by wet chemical etching or dry etching. For AlGaInP micro LEDs on a GaAs substrate, wet chemical etching is preferably used for substrate removal. After the substrate removal, the adhesive 260 between LEDs 240 may be recess etched to expose more of the sidewalls of the micro LEDs, thus providing more clearance in the spaces between the micro LEDs and facilitating easier separation of the micro LEDs from adhesive 260 and carrier substrate 250 after bonded to pixel driver die 210.

Figure 2D:
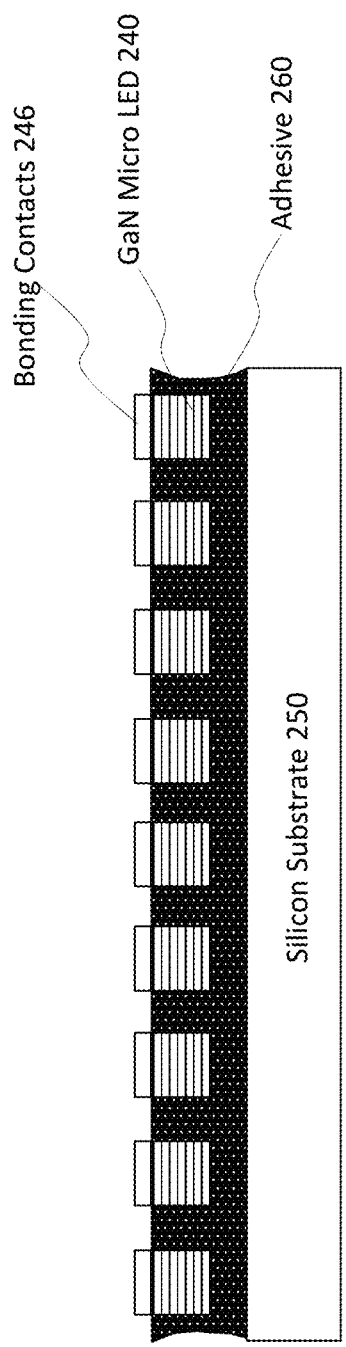
Figure 2E:
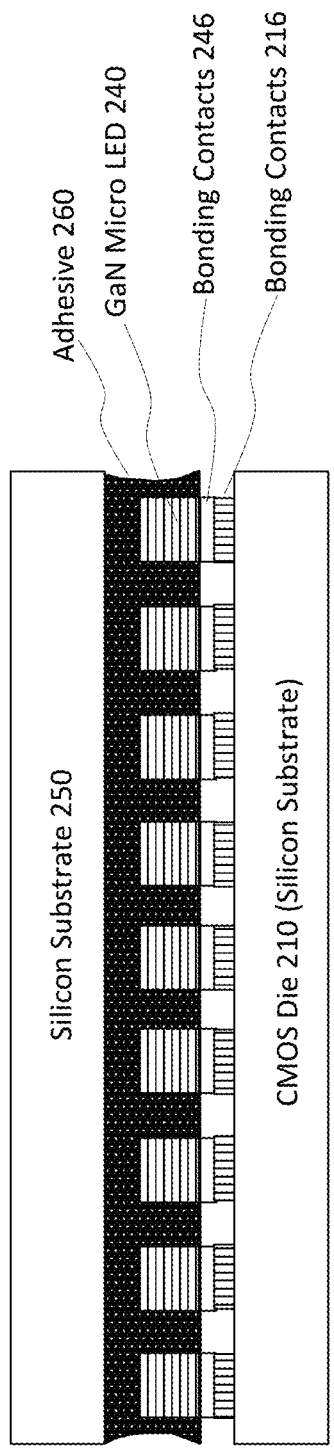

In FIG. 2D, bonding contacts 246 are deposited on the micro LEDs 240. In FIG. 2E, these bonding contacts 246 are bonded to the corresponding contacts 216 on the die 210 that includes the pixel drivers. For convenience, that die will be referred to as the CMOS die 210. It uses a silicon substrate in this example. Because the carrier substrate 250 is also silicon, the two substrates expand and contract at the same rate during the thermal cycling of the bonding process.

Figure 2F:
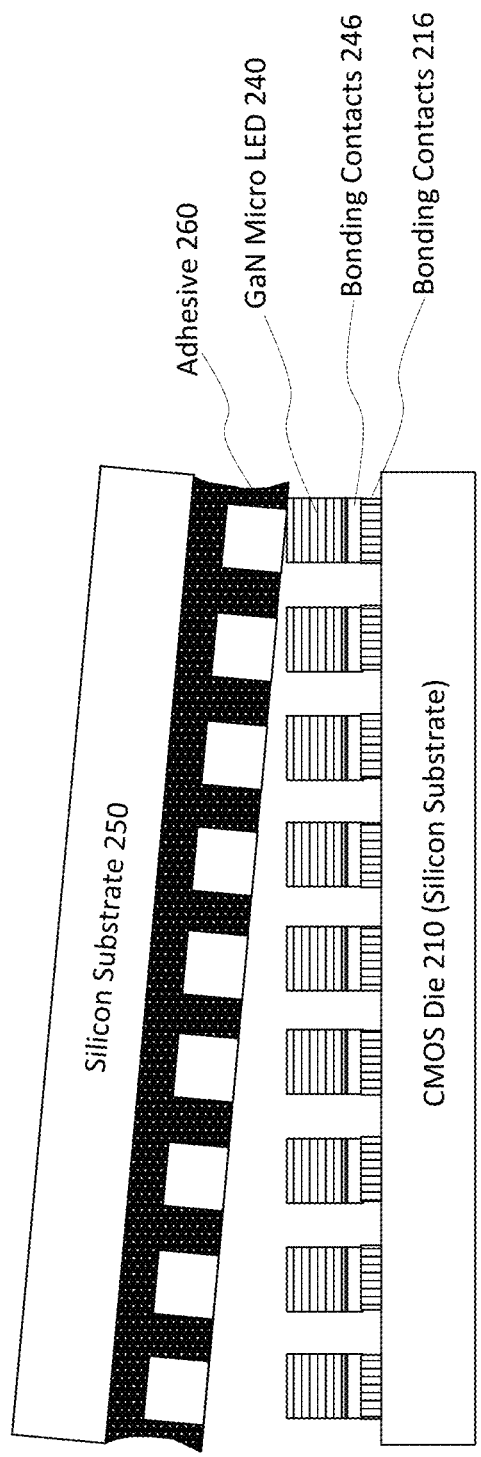

In FIG. 2F, the carrier substrate 250 is separated from the micro LED array 240 by releasing the adhesive 260. Due to the weak bonding between the micro LEDs 240 and the surrounding adhesive 260, mechanical exfoliation is preferably used to separate the carrier substrate 250 and the adhesive 260 from the micro LEDs 240. To ensure good transfer yield of micro LEDs 240 to the CMOS die 210, the bonding strength between the micro LEDs 240 and adhesive 260 can be tailored by inserting a low adhesion layer between them, and by recess etching the adhesive 260 to expose the entire sidewall of the micro LEDs 240 to minimize the contact area between them. Other techniques such as laser irradiation, wet etching, or dry etching can also be used to remove the carrier substrate 250 and the adhesive 260. After release, excessive adhesive remaining on the CMOS die 210 may be removed, for example by wet etching or dry etching. The device now includes an array of micro LEDs 240 bonded to an array of corresponding pixel drivers.

Mass transfer of micro LEDs from a donor substrate to an acceptor substrate is beneficial because many micro LEDs may be transferred in parallel. The examples described herein refer to die, but it should be understood that these techniques can be readily applied at the wafer-level to the die before they are singulated from the wafer.

Figure 3B:
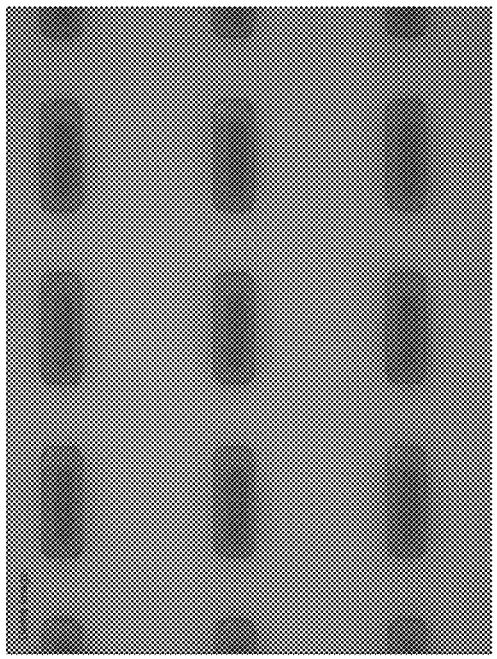
FIGS. 3A and 3B are microscopic images of micro LEDs on a final substrate.
Figure 3D:
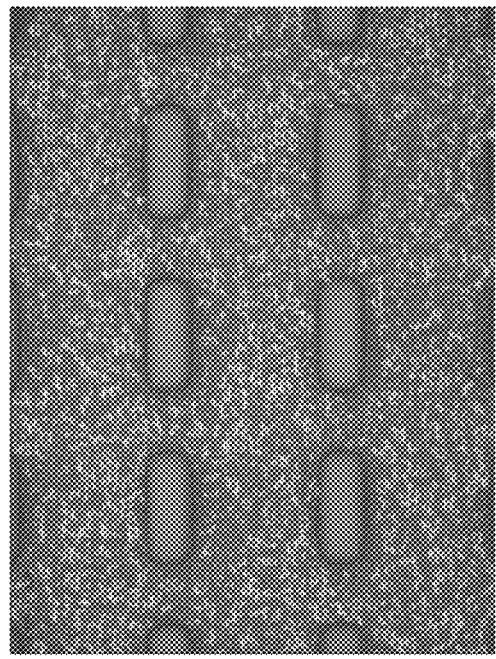
FIGS. 3C and 3D are microscopic images of a carrier substrate after the transfer of micro LEDs.
Figure 3A:
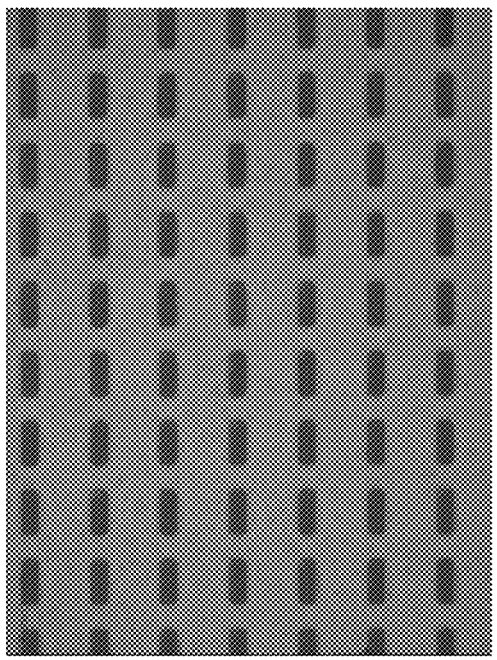
Figure 3C:
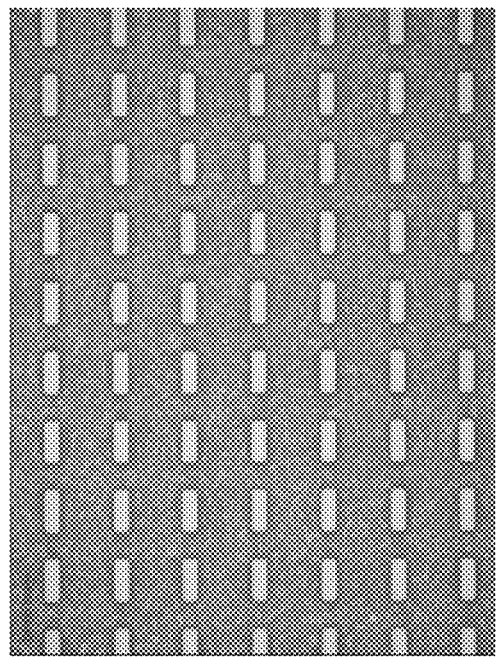

FIGS. 3A-3D show microscopic images of micro LED arrays transferred onto carrier substrates and acceptor substrates. FIGS. 3A and 3B show the acceptor substrate with micro LEDs arranged regularly on top after the transfer process. FIGS. 3C and 3D show the carrier substrate after the transfer of micro LEDs.

Figure 4A:
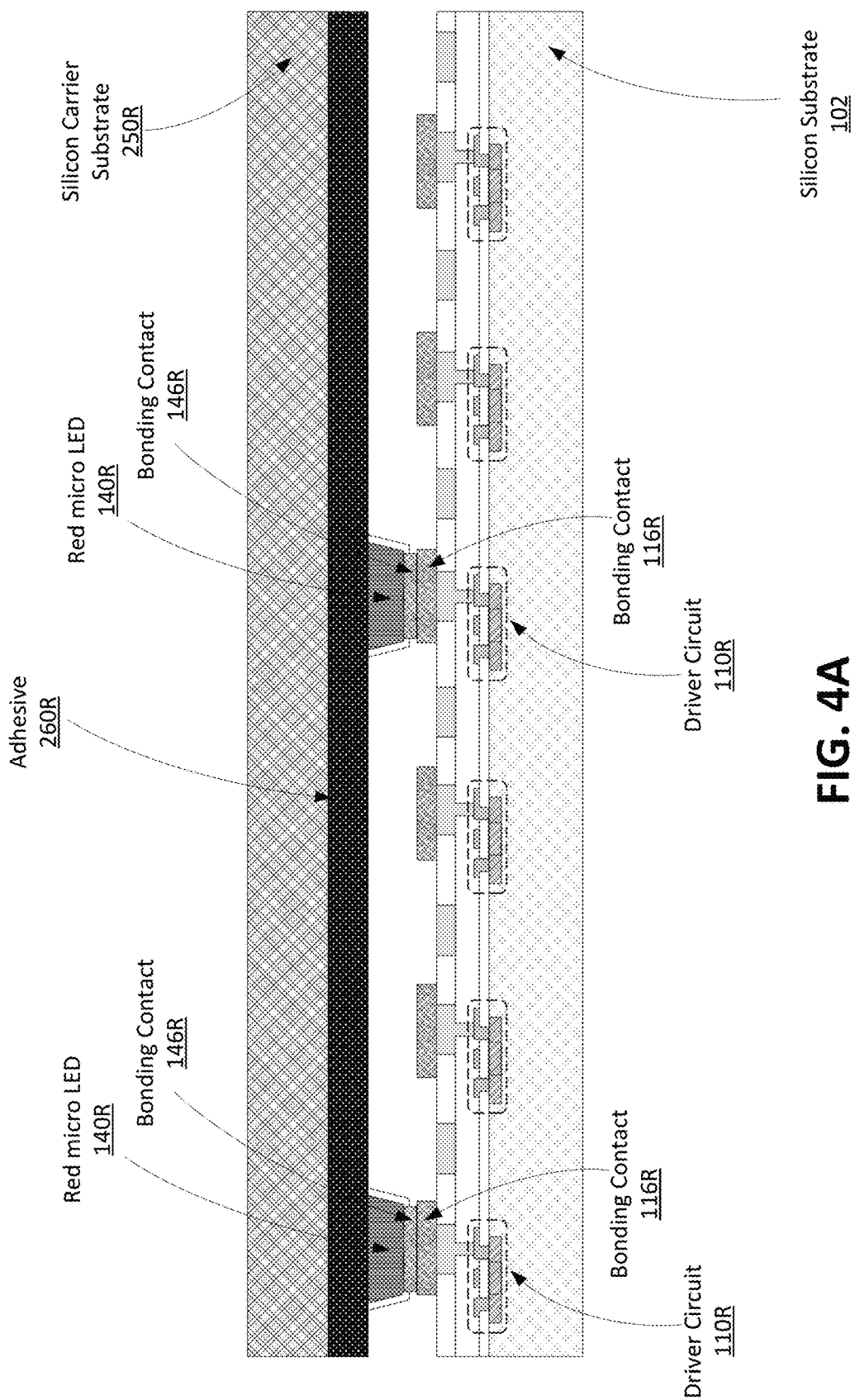
FIGS. 4A-4D are cross-sectional views illustrating fabrication of another integrated micro LED display panel, according to one embodiment.
Figure 4B:
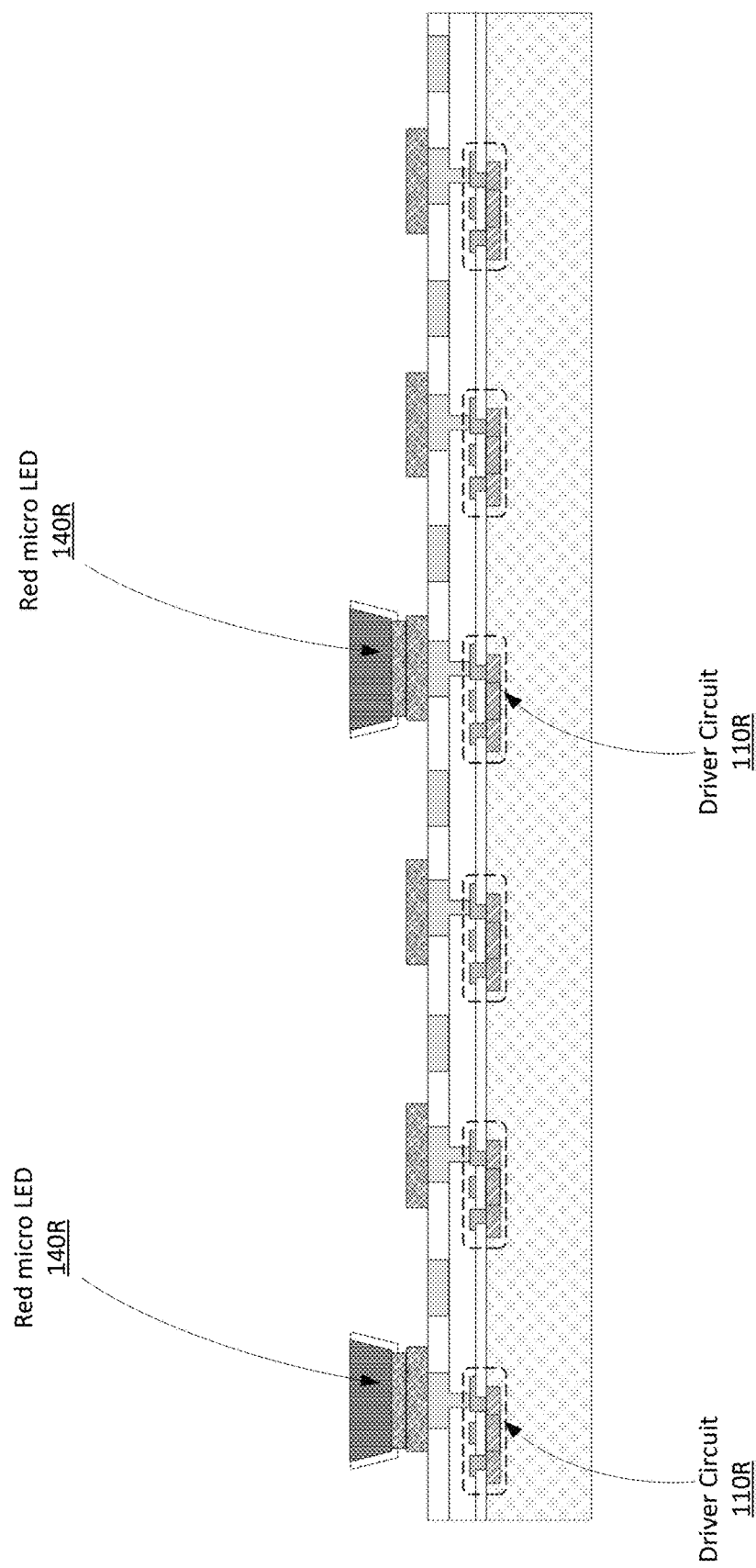

FIGS. 4A-4D show application of the process shown in FIGS. 2A-2F, to fabricate full color micro LED displays which requires multiple mass transfers of red, green, and blue micro LEDs to the pixel driver circuits. FIG. 4A shows the device at a step corresponding to FIG. 2E. The red micro LEDs 140R have already been transferred from their native substrate to the silicon carrier substrate 250R using adhesive 260R. Bonding contacts 146R have been added to the micro LEDs 140R and the entire device has been eutectically bonded to the corresponding bonding contacts 116R on the CMOS die containing the driver circuits 110R. The substrate 102 for the CMOS circuitry is silicon. FIG. 4B shows the device after removal of the carrier substrate 250R by release of adhesive 260R.

Figure 4C:
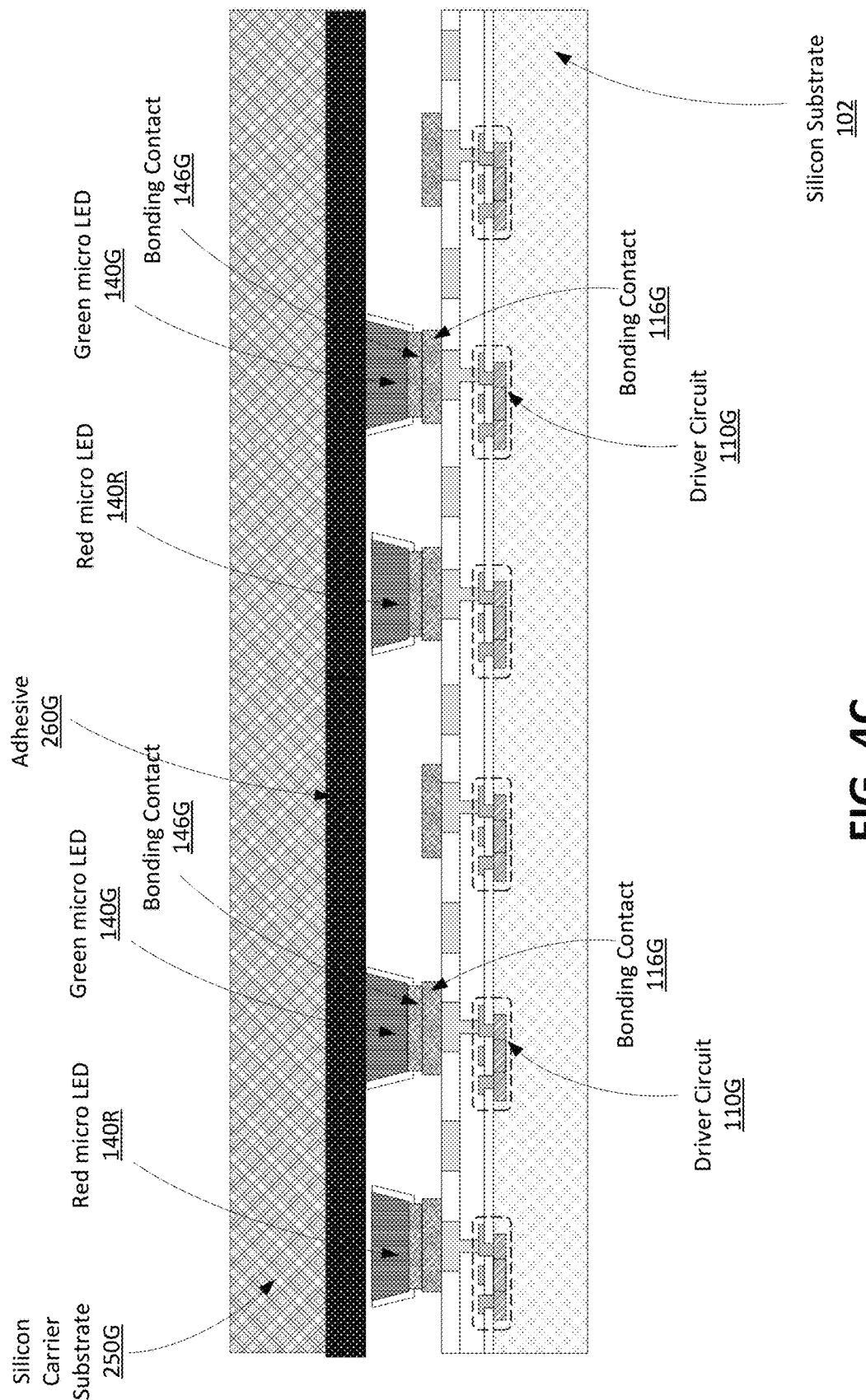

The process is repeated for green and blue micro LEDs. FIG. 4C shows attachment of the green micro LEDs 140G to the CMOS die. The green micro LEDs 140G have been transferred from their native substrate to the silicon carrier substrate 250G using adhesive 260G. Bonding contacts 246G have been added to the micro LEDs 140G and the array has been eutectically bonded to the corresponding bonding contacts 116G on the CMOS die containing the driver circuits 110G.

Note that in this case, there must be space between the green micro LEDs 140G to allow for the existing red micro LEDs 140R. If the adhesive 260G originally extends between the green micro LEDs 140G, it may be etched or otherwise removed to create space between the green micro LEDs 140G. More generally, material between the micro LEDs 140G, including the adhesive and the substrate, may be removed to increase the vertical clearance in the areas between the micro LEDs 140G. Additional layers may also be added between the micro LEDs 140G and the substrate 250G or the thickness of the adhesive 260G may be increased to further increase the height of the micro LEDs 140G above the substrate 250G.

Figure 4D:
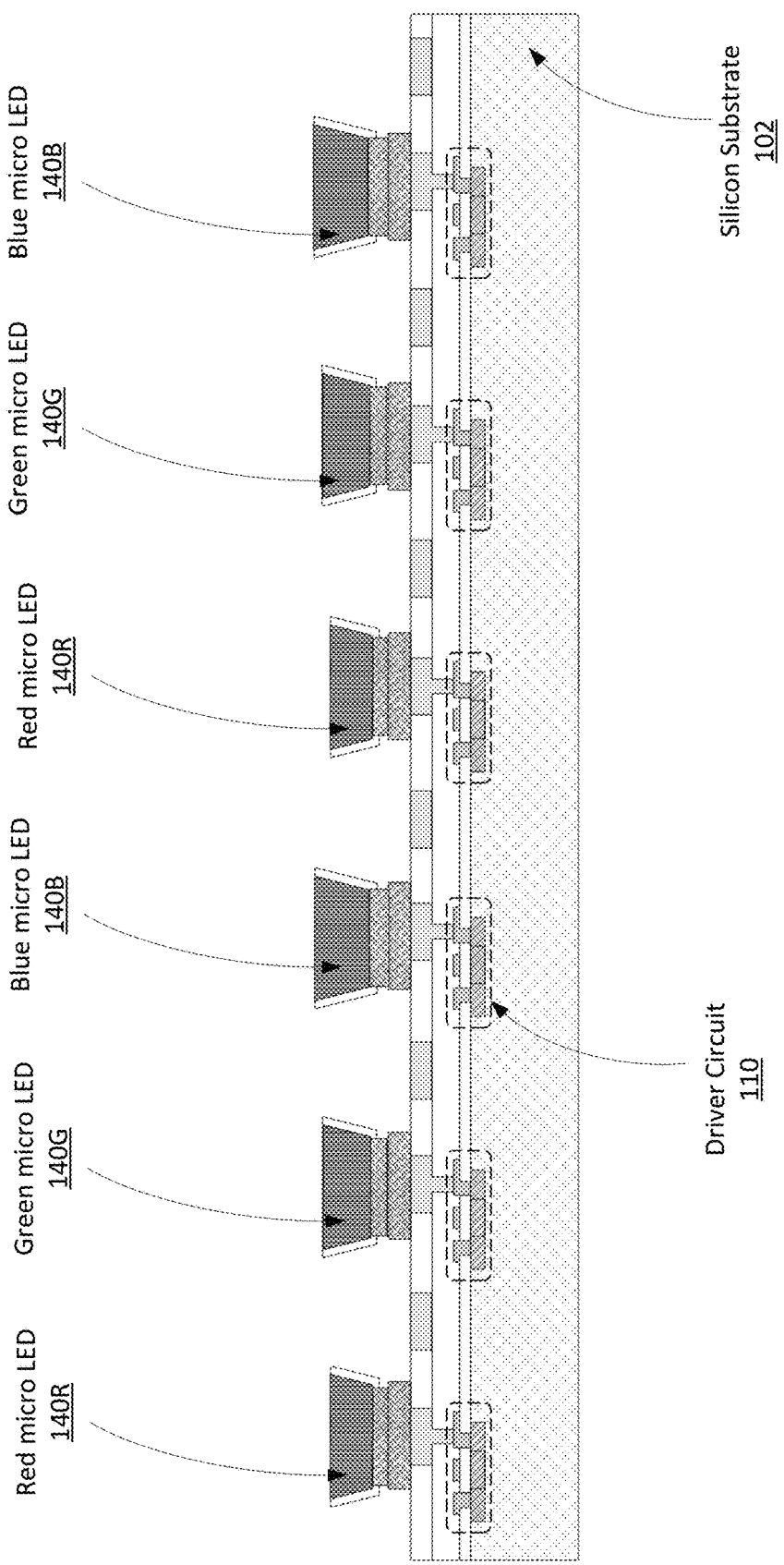

FIG. 4D shows the integrated micro LED display after integration of red, green and blue micro LEDs 140.

Figure 5:
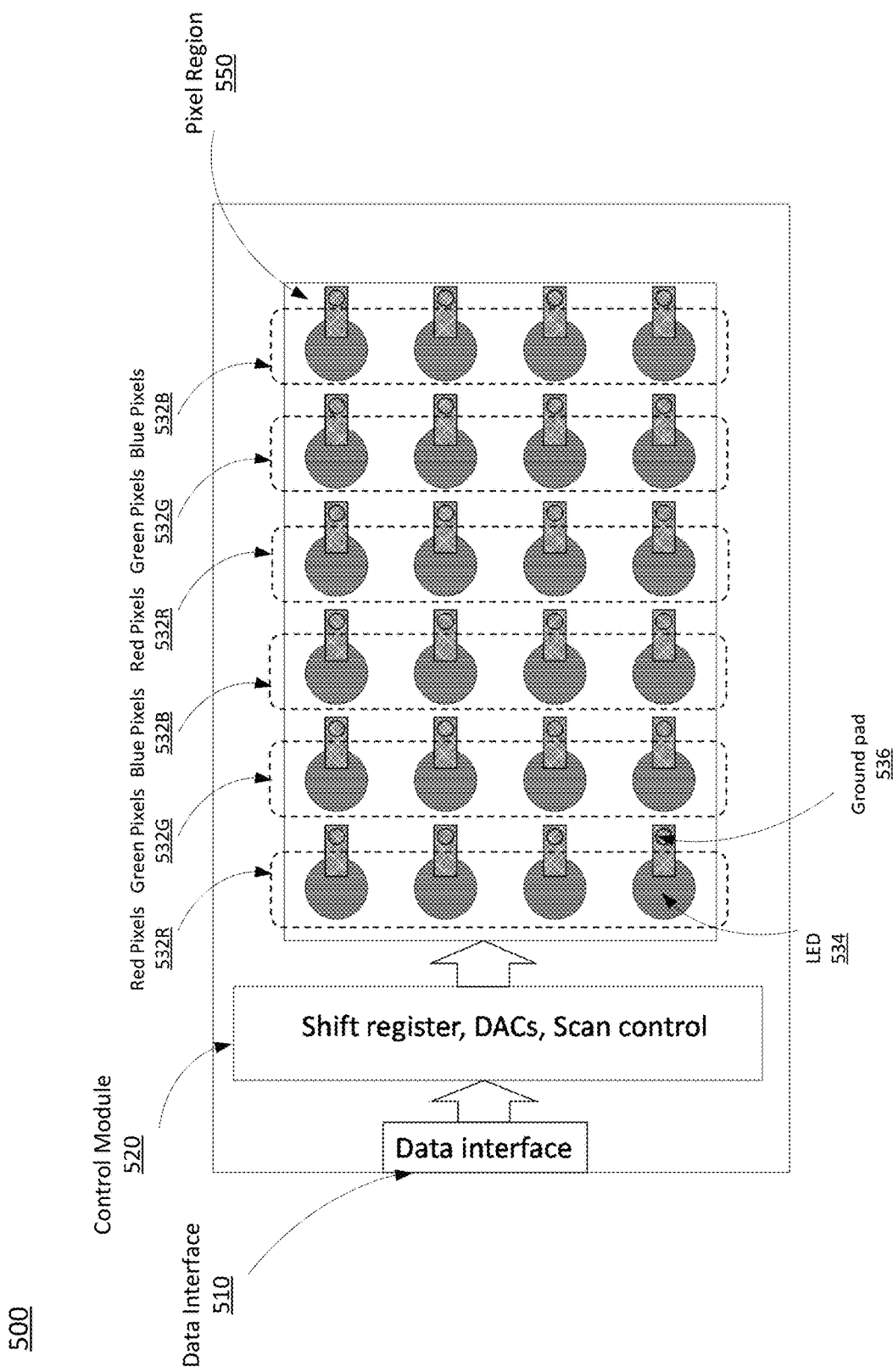
FIG. 5 is a top view of an example integrated micro LED display panel, according to one embodiment.

Once red, green, blue micro LEDs are transferred to the pixel driver die, electrical connection is formed between the top semiconductor layer of micro LEDs and the common electrode of the pixel driver die. FIG. 5 is a top view of an example micro LED display panel, according to one embodiment. The display panel includes a data interface 510, a control module 520 and a pixel region 540. The data interface 510 receives data defining the image to be displayed. The source(s) and format of this data will vary depending on the application. The control module 520 receives the incoming data and converts it to a form suitable to drive the pixels in the display panel. The control module 520 may include digital logic and/or state machines to convert from the received format to one appropriate for the pixel region 540, shift registers or other types of buffers and memory to store and transfer the data, digital-to-analog converters and level shifters, and scan controllers including clocking circuitry.

The pixel region 540 includes an array of pixels. The pixels include micro LEDs 534 monolithically integrated with pixel drivers, for example as described above or in the following figures. In this example, the display panel is a color RGB display panel. It includes red, green and blue pixels, arranged in columns. Columns 532R are red pixels, columns 532G are green pixels and columns 532B are blue pixels. Within each pixel, a micro LED 534 is controlled by a pixel driver. The pixel makes contact to a supply voltage (not shown) and ground via a ground pad 536, and also to a control signal, according to the embodiments shown previously. Although not shown in FIG. 5, the p-electrode of micro LED and the output of the driving transistor are positioned underneath the micro LED 534, and they are electrically connected by bonding metal. The micro LED current driving signal connection (between p-electrode of micro LED and output of the pixel driver), ground connection (between n-electrode and system ground), the Vdd connection (between source of the pixel driver and system Vdd), and the control signal connection to the gate of the pixel driver are made in accordance with various embodiments described previously.

FIG. 5 is merely a representative figure. Other designs will be apparent. For example, the colors do not have to be red, green and blue, and there do not have to be equal numbers of each color pixel. They also do not have to be arranged in columns or stripes. A set of four color pixels could be arranged as a 2×2 square, for example. As one example, apart from the arrangement of a square matrix of pixels shown in FIG. 5, an arrangement of hexagonal matrix of pixels can also be used to form the display panel.

In some applications, a fully programmable rectangular array of pixels is not necessary. Other designs of display panels with a variety of shapes and displays may also be formed using the device structures described herein. One class of examples is specialty applications, including signage and automotive. For example, multiple pixels may be arranged in the shape of a star or a spiral to form a display panel, and different patterns on the display panel can be produced by turning on and off the micro LEDs. Another specialty example is automobile headlights and smart lighting, where certain pixels are grouped together to form various illumination shapes and each group of micro LED pixels can be turned on or off or otherwise adjusted by individual pixel drivers.

Different types of display panels can be fabricated. For example, the resolution of a display panel can range typically from 8×8 to 4096×2160. Common display resolutions include QVGA with 320×240 resolution and an aspect ratio of 4:3, XGA with 1024×768 resolution and an aspect ratio of 4:3, HD with 1280×720 resolution and an aspect ratio of 16:9, FHD with 1920×1080 resolution and an aspect ratio of 16:9, UHD with 3840×2160 resolution and an aspect ratio of 16:9, and 4K with 4096×2160 resolution. There can also be a wide variety of pixel sizes, ranging from sub-micron and below to 10 mm and above. The size of the overall display region can also vary widely, ranging from diagonals as small as tens of microns or less up to hundreds of inches or more.

Different applications will also have different requirements for optical brightness. Example application include direct viewing display screens, light engines for home/office projectors and portable electronics such as smart phones, laptops, wearable electronics, and retinal projections. The power consumption can vary from as low as a few milliwatts for retinal projectors to as high as kilowatts for large screen outdoor displays, projectors, and smart automobile headlights. In terms of frame rate, due to the fast response (nano seconds) of inorganic micro LEDs, the frame rate can be as high as KHz, or even MHz for small resolutions.

Figure 6A:
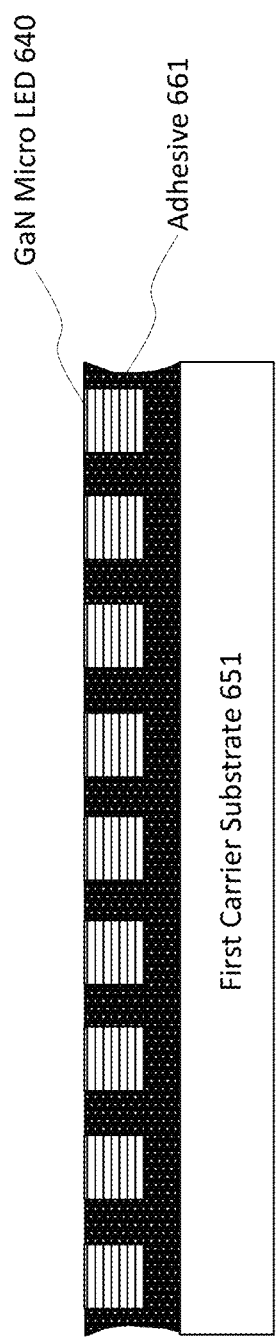
FIGS. 6A-6D are cross-sectional views illustrating fabrication of an integrated micro LED display panel by a double flip mass transfer adhesive process, according to one embodiment.
Figure 6B:
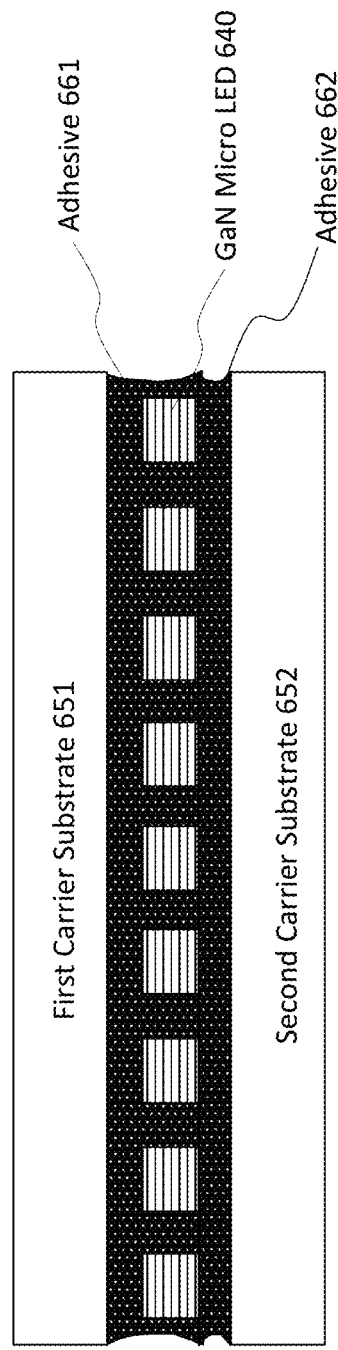
Figure 6C:
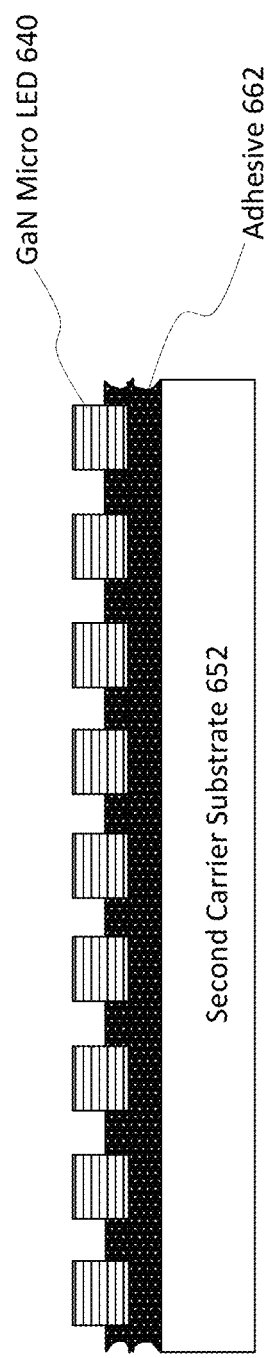
Figure 6D:
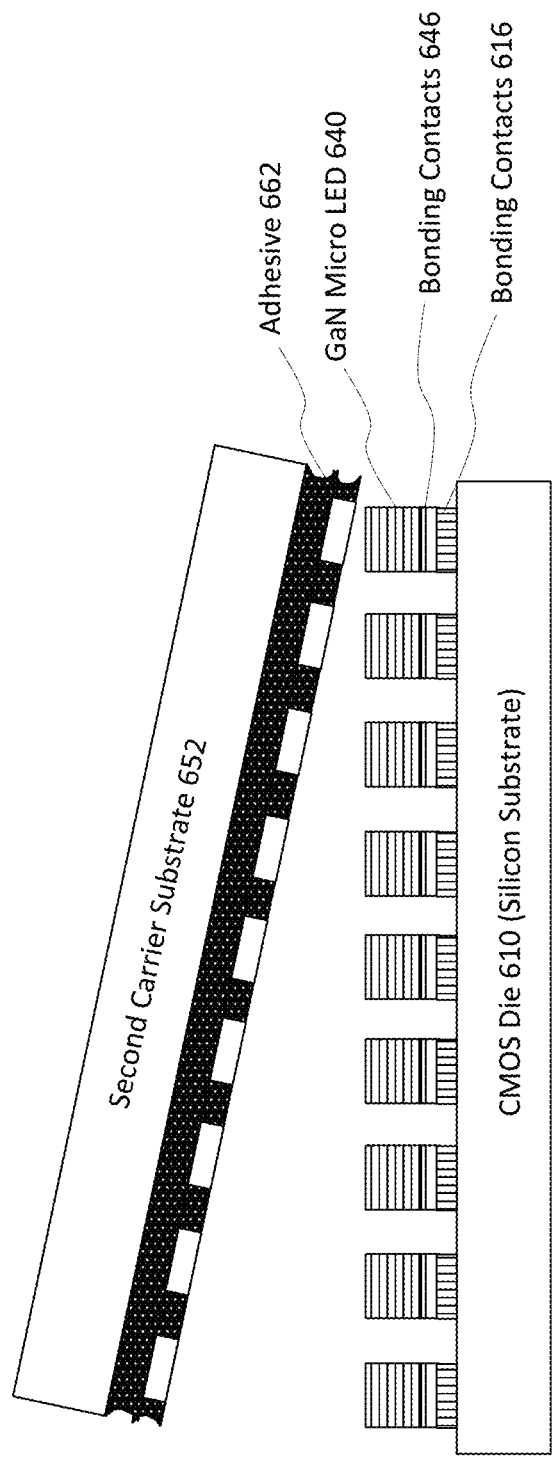

The example of FIG. 2 is a "single transfer" or "single flip" process. The micro LED array is transferred once to a carrier substrate, with the orientation of the LEDs flipped during transfer. For most widely used epi wafers in the LED industry, the top epi-layer is p-type semiconductor, such as p-GaN for blue/green LEDs and p-GaP for red LEDs. After the single transfer process to the carrier substrate with adhesive and removal of the epi-substrate, the polarity of the micro LEDs is flipped with the top top epi-layer being n-type semiconductor. However, the transfer process can be repeated to control the polarity of the micro LEDs' top surface. FIGS. 6A-6D are an example of a "double transfer" or "double flip" process. In FIG. 6A, the micro LED array 640 has already been transferred to a first carrier substrate 651 using adhesive 661. Rather than attaching the micro LEDs to the CMOS die, it is instead transferred to a second carrier substrate 652 and then attached to the CMOS die, as shown in FIGS. 6B-6D. This might be done because the micro LEDs 640 are not oriented correctly in FIG. 6A. That is, the unexposed side of the micro LEDs 640 may be the side to be bonded to the CMOS die. Therefore, the micro LEDs 640 are flipped once before bonding to reorient them.

In FIG. 6B, the micro LED array plus carrier substrate 651 are attached to a second carrier substrate 652 using additional adhesive 662. As shown in FIG. 6C, the first carrier substrate 651 is separated from the micro LED array by releasing the adhesive 661, leaving the micro LED array 640 supported by the second carrier substrate 652. Note that the micro LED array in FIG. 6C is upside down compared to its orientation in FIG. 6A.

As shown in FIG. 6D, bonding contacts 646 are added, and the micro LED array supported by substrate 652 is bonded to corresponding contacts 616 on the CMOS die 610. The carrier substrate 652 is then separated from the micro LED array 640 by releasing the adhesive 662. In FIG. 6D, the micro LEDs 640 are "upside down" compared to the micro LEDs 240 in the single flip process of FIG. 2F.

Figure 7:
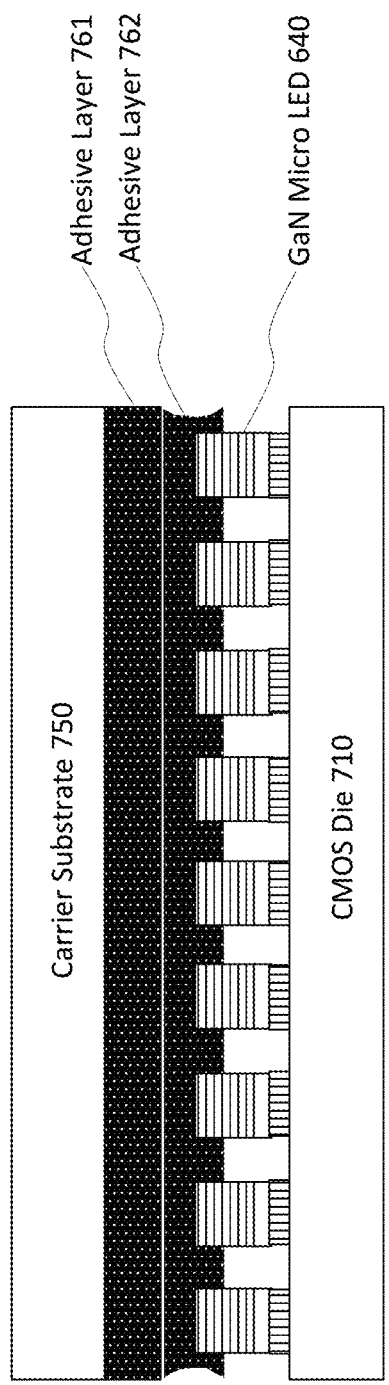
FIG. 7 is a cross-sectional views illustrating fabrication of an integrated micro LED display panel by a transfer adhesive process using multiple layers of adhesive, according to one embodiment.

FIG. 7 shows an example where the adhesive has two layers 761 and 762. For example, these may be two different adhesives. This may be used to facilitate separation of the carrier substrate 750 from the micro LED array 640 and CMOS die 710. For example, the interface between the two adhesive layers 761,762 may be designed to facilitate separation. Alternatively, the adhesive layer 761 may facilitate selective wet etching or laser irradiation if the adhesive layer 762 is not amenable to these techniques. The residual adhesive layer 762 may then be removed by dry etching, for example.

Figure 8A:
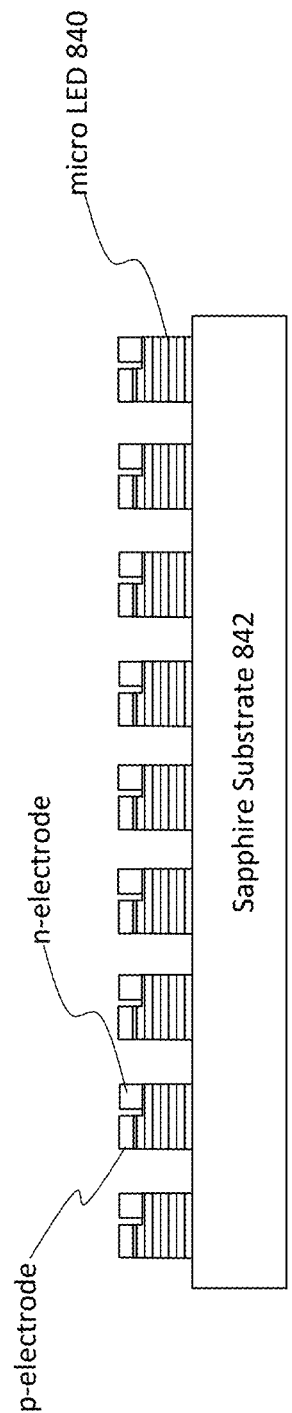
FIGS. 8A-8B are cross-sectional views illustrating fabrication of another kind of integrated micro LED display panel by double flip mass transfer adhesive process, according to one embodiment.
Figure 8B:
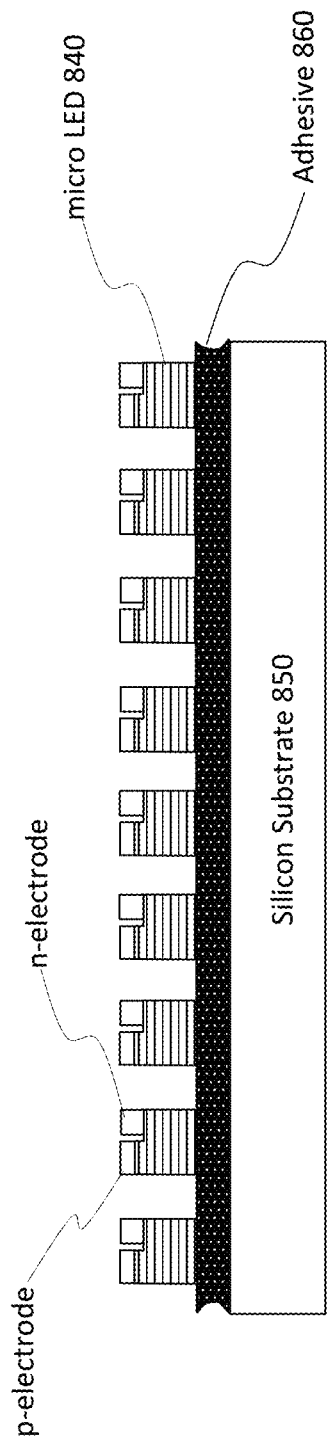

FIGS. 8A-8B show an example where the micro LEDs have additional structure when they are mass transferred. In FIG. 8A, p- and n-electrodes to the micro LED 840 are already formed while the micro LED is still supported by the native sapphire substrate 842. The micro LED array 840 with electrodes is transferred to a silicon carrier substrate 850 using the double flip process described previously. The result is shown in FIG. 8B. This can then be bonded to the CMOS die. Alternately, it can be attached to the CMOS die using an adhesive with conductive particles that form electrical connections between the micro LED electrodes and the corresponding devices on the CMOS die.

Figure 9A:
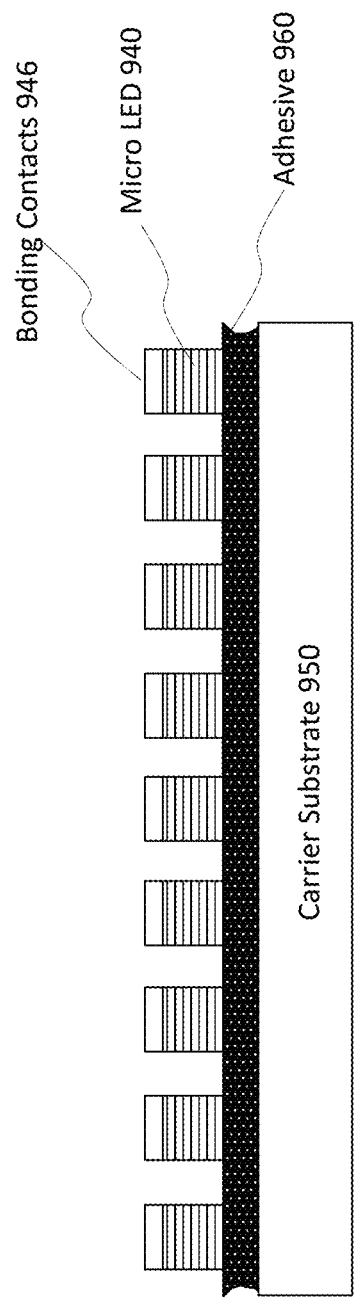
FIGS. 9A-9C are cross-sectional views illustrating fabrication of an integrated micro LED display panel by another mass transfer adhesive process, according to one embodiment.
Figure 9B:
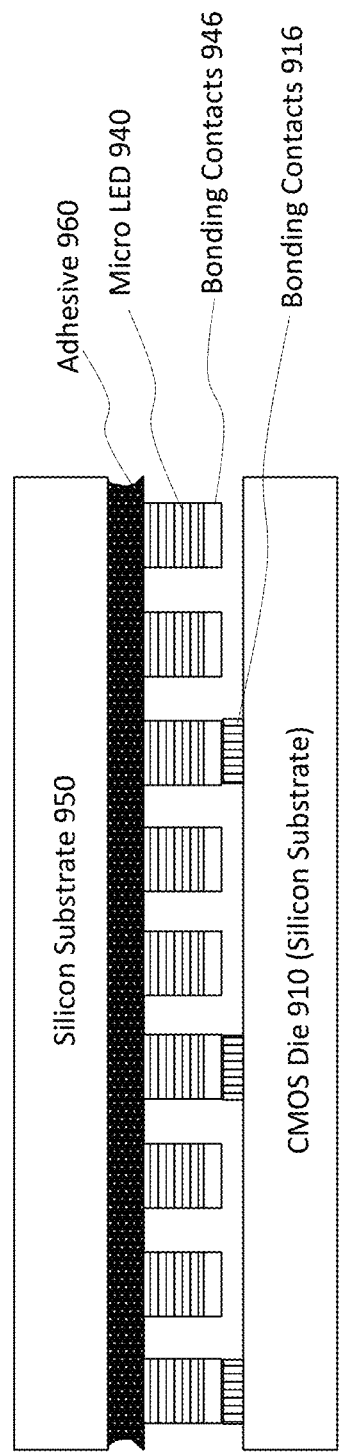
Figure 9C:
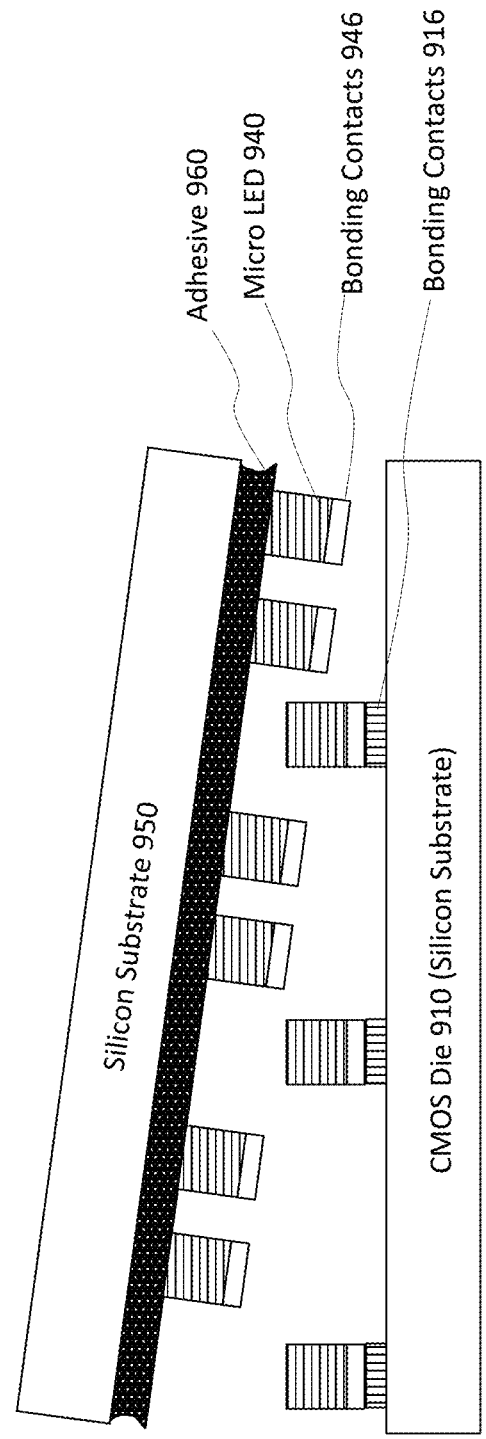

FIGS. 9A-9C show an example where not all of the micro LEDs are released at once. FIG. 9A shows a micro LED array 940 after transfer to a carrier silicon substrate 950 using adhesive 960. Bonding contacts 946 have already been deposited. This is similar to the structure in FIG. 2D. However, as shown in FIGS. 9B and 9C, only every third micro LED 940 is bonded to the CMOS die 910. After this process, the carrier substrate 950 contains additional micro LEDs 940 which may then be bonded to other CMOS die.

Although the detailed description contains many specifics, these should not be construed as limiting the scope of the invention but merely as illustrating different examples. It should be appreciated that the scope of the disclosure includes other embodiments not discussed in detail above. For example, the bonding pad metals can be Au/Sn, Au/In, or In/Pd. As another example, the bonding pads on the CMOS die 910 and red, green, and blue micro LED template (FIG. 9A) can be arranged such that only a selected portion of the red/green/blue micro LEDs on the red/green/blue template are bonded to their designated red/green/blue pixels. The rest of the micro LEDs on the same template do not bond to any pad on the CMOS die 910. Various other modifications, changes and variations which will be apparent to those skilled in the art may be made in the arrangement, operation and details of the method and apparatus disclosed herein without departing from the spirit and scope as defined in the appended claims. Therefore, the scope of the invention should be determined by the appended claims and their legal equivalents.

What is claimed is:

1. A method for fabricating an integrated micro LED display comprising:
   for each of two or more micro LED die comprising an array of micro LEDs fabricated on a first substrate, attaching the micro LED array to a CMOS die, the CMOS die comprising an array of corresponding pixel drivers fabricated on a CMOS substrate, wherein attaching the micro LED array to the CMOS die comprises:
      transferring the micro LED array to a second substrate by use of an adhesive, including separating the first substrate from the micro LED array, the micro LED array supported by the second substrate, wherein each micro LED has a bonding metal pad and each of the pixel drivers that corresponds to one of the micro LEDs also has a bonding metal pad;
      aligning and bonding the bonding metal pads for the micro LED array supported by the second substrate to the corresponding bonding metal pads for the array of pixel drivers wherein, during the aligning and bonding process, the micro LED array has a protrusion height above the second substrate that is sufficient to provide clearance for other micro LED arrays that were previously bonded to the CMOS die; and
      removing the second substrate by releasing the adhesive before aligning and bonding the next micro LED array.

2. The method of claim 1 wherein the bonding occurs at an elevated temperature, the first substrate and CMOS substrate are incompatible for bonding at the elevated temperature due to different thermal coefficients of expansion but the second substrate and CMOS substrate have thermal coefficients of expansion that are compatible for bonding at the elevated temperature.

3. The method of claim 1 wherein the first substrate is one of sapphire, silicon, GaAs and SiC substrates; and the second substrate is one of sapphire, silicon, glass, ceramic and polymer substrates.

4. The method of claim 1 wherein the adhesive is one of SU-8, benzocyclobutene (BCB), polyimide, polybenzoxazole (PBO), silicone or a thermal release coating.

5. The method of claim 1 wherein transferring the micro LED array to the second substrate by use of the adhesive comprises thermal treatment or UV irradiation to cure the adhesive.

6. The method of claim 1 wherein removing the second substrate by releasing the adhesive comprises at least one of laser irradiation, wet etching the adhesive, dry etching the adhesive, a thermal process, and mechanical exfoliation to release the adhesive.

7. The method of claim 1 wherein removing the second substrate by releasing the adhesive comprises mechanical exfoliation to release the adhesive, wherein an adhesion control layer is inserted between the micro LEDs and the adhesive to facilitate mechanical exfoliation of the micro LEDs from the adhesive.

8. The method of claim 1 further comprising:
removing excess adhesive after the second substrate has been removed by releasing the adhesive.

9. The method of claim 8 wherein removing excess adhesive comprises wet etching or dry etching to remove excess adhesive.

10. The method of claim 1 wherein the adhesive comprises two adhesive layers, and removing the second substrate by releasing the adhesive comprises releasing the one of the two adhesive layers that is closer to the second substrate.

11. The method of claim 1 wherein transferring the micro LED array to the second substrate by use of the adhesive comprises:
attaching the micro LED array supported by the first substrate to the second substrate by use of the adhesive; and
separating the first substrate from the micro LED array, while the micro LED array is attached to the second substrate.

12. The method of claim 1 wherein transferring the micro LED array to the second substrate by use of the adhesive comprises:
attaching the micro LED array supported by the first substrate to an intermediate substrate;
separating the first substrate from the micro LED array, while the micro LED array is attached to the intermediate substrate;
attaching the micro LED array supported by the intermediate substrate to the second substrate by use of the adhesive; and
separating the intermediate substrate from the micro LED array, while the micro LED array is attached to the second substrate.

13. The method of claim 1 further comprising:
while the micro LED array is supported by the second substrate, removing adhesive in areas outside the micro LED array to increase the protrusion height of the micro LED array above the second substrate to provide clearance for the other micro LED arrays that were previously bonded to the CMOS die.

14. The method of claim 1 wherein transferring the micro LED array to the second substrate by use of the adhesive comprises a use of additional layer(s) between the micro LED array and the second substrate to increase the protrusion height of the micro LED array above the second substrate to provide clearance for the other micro LED arrays that were previously bonded to the CMOS die.

15. The method of claim 1 wherein the micro LED die contains multiple micro LED arrays, and each micro LED array is separately attached to a different CMOS die.

16. The method of claim 1 wherein the method is performed on a wafer scale before individual dies are singulated from the wafer.

17. The method of claim 1 wherein bonding the micro LED array to the array of pixel drivers comprises eutectic bonding or electrically conductive bonding.

18. The method of claim 1 wherein the micro LED die includes contacts to the array of micro LEDs, and transferring the micro LED array to the second substrate by use of the adhesive comprises transferring the micro LED array with contacts to the second substrate by use of the adhesive.

* * * * *